(12) United States Patent
Tachikawa et al.

(10) Patent No.: US 8,199,528 B2
(45) Date of Patent: Jun. 12, 2012

(54) ELECTRONIC DEVICE AND GROUND CONNECTION STRUCTURE

(75) Inventors: Tadanori Tachikawa, Kawasaki (JP); Masuo Ohnishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 581 days.

(21) Appl. No.: 12/320,490

(22) Filed: Jan. 27, 2009

(65) Prior Publication Data

US 2009/0298357 A1 Dec. 3, 2009

(30) Foreign Application Priority Data

May 30, 2008 (JP) ................................. 2008-143311

(51) Int. Cl.
*H05K 7/20* (2006.01)
(52) U.S. Cl. ........ 361/816; 361/818; 361/753; 174/350; 174/351
(58) Field of Classification Search .................... 361/816
See application file for complete search history.

(56) References Cited

U.S. PATENT DOCUMENTS

| | | | | |
|---|---|---|---|---|
| 4,927,367 A | * | 5/1990 | Salvagno | 439/92 |
| 5,138,529 A | * | 8/1992 | Colton et al. | 361/816 |
| 5,707,244 A | * | 1/1998 | Austin | 439/95 |
| 5,833,480 A | * | 11/1998 | Austin | 439/95 |
| 5,978,232 A | * | 11/1999 | Jo | 361/796 |
| 6,019,614 A | * | 2/2000 | Baur et al. | 439/92 |
| 6,071,131 A | * | 6/2000 | Pliml, Jr. | 439/95 |
| 6,388,189 B1 | * | 5/2002 | Onoue | 174/383 |
| 6,780,030 B2 | * | 8/2004 | Yoshinaga et al. | 439/92 |
| 6,924,437 B1 | * | 8/2005 | Creekmore et al. | 174/138 G |
| 7,357,645 B2 | * | 4/2008 | Jeong et al. | 439/66 |
| 7,633,762 B2 | * | 12/2009 | Yonezawa et al. | 361/753 |
| 7,719,857 B2 | * | 5/2010 | Ogawa | 361/816 |
| 2006/0067062 A1 | | 3/2006 | Ishimoto et al. | |
| 2008/0106358 A1 | * | 5/2008 | Katagiri | 334/85 |

FOREIGN PATENT DOCUMENTS

| | | |
|---|---|---|
| EP | 0 762 822 B1 | 5/1998 |
| JP | 61-153388 | 9/1986 |
| JP | 5-50786 | 7/1993 |
| JP | 11-330734 | 11/1999 |
| JP | 2004-72051 | 3/2004 |
| JP | 2005-302789 | 10/2005 |
| JP | 2006-93549 | 4/2006 |
| JP | 2006-332515 | 12/2006 |
| KR | 10-2006-0082297 | 7/2006 |

OTHER PUBLICATIONS

Chinese Office Action issued Jan. 26, 2011 in corresponding Chinese Patent Application 200910006174.8.
Korean Office Action issued Oct. 22, 2010 in corresponding Korean Patent Application 10-2009-0008710.
Korean Office Action for related Korean Patent Application No. 10-2009-0008710, mailed on Jun. 30, 2011.
Office Action issued by the Japanese Patent Office on Mar. 21, 2012 in the corresponding Japanese patent application 2008-143311.

* cited by examiner

*Primary Examiner* — Anthony Q Edwards
(74) *Attorney, Agent, or Firm* — Staas & Halsey LLP (57) ABSTRACT

An electronic device including: a circuit board on which an electronic component is mounted; a plate material which is used as a ground, the plate material being extended in parallel with the circuit board; and a ground connection member which includes a fixed section and multiple elastic leg sections, the fixed section being tightened to the circuit board and connected to a ground on the circuit board, the elastic leg sections being extended from the fixed section toward different directions along the circuit board, each of the elastic leg sections being extended onto the plate material side to elastically press the plate material.

3 Claims, 10 Drawing Sheets

ELECTRONIC DEVICE AND GROUND CONNECTION STRUCTURE

CROSS-REFERENCE TO RELATED APPLICATION

This application is based upon and claims the benefit of priority of the prior Japanese Patent Application No. 2008-143311, filed on May 30, 2008, the entire contents of which are incorporated herein by reference.

FIELD

The embodiments discussed herein are related to an electronic device including a ground connection structure located between a ground on a circuit board and a plate material which is used as a ground while spread in parallel with the circuit board, and the ground connection structure.

BACKGROUND

In an electronic device in which a circuit board is incorporated in a metal chassis, a Frame-Ground connection (FG connection) of the circuit board to the chassis is frequently performed. In the FG connection, a ground pattern is provided in the circuit board in order to stably operate a circuit in the circuit board, and the ground pattern is electrically connected to the chassis.

Figure 7:
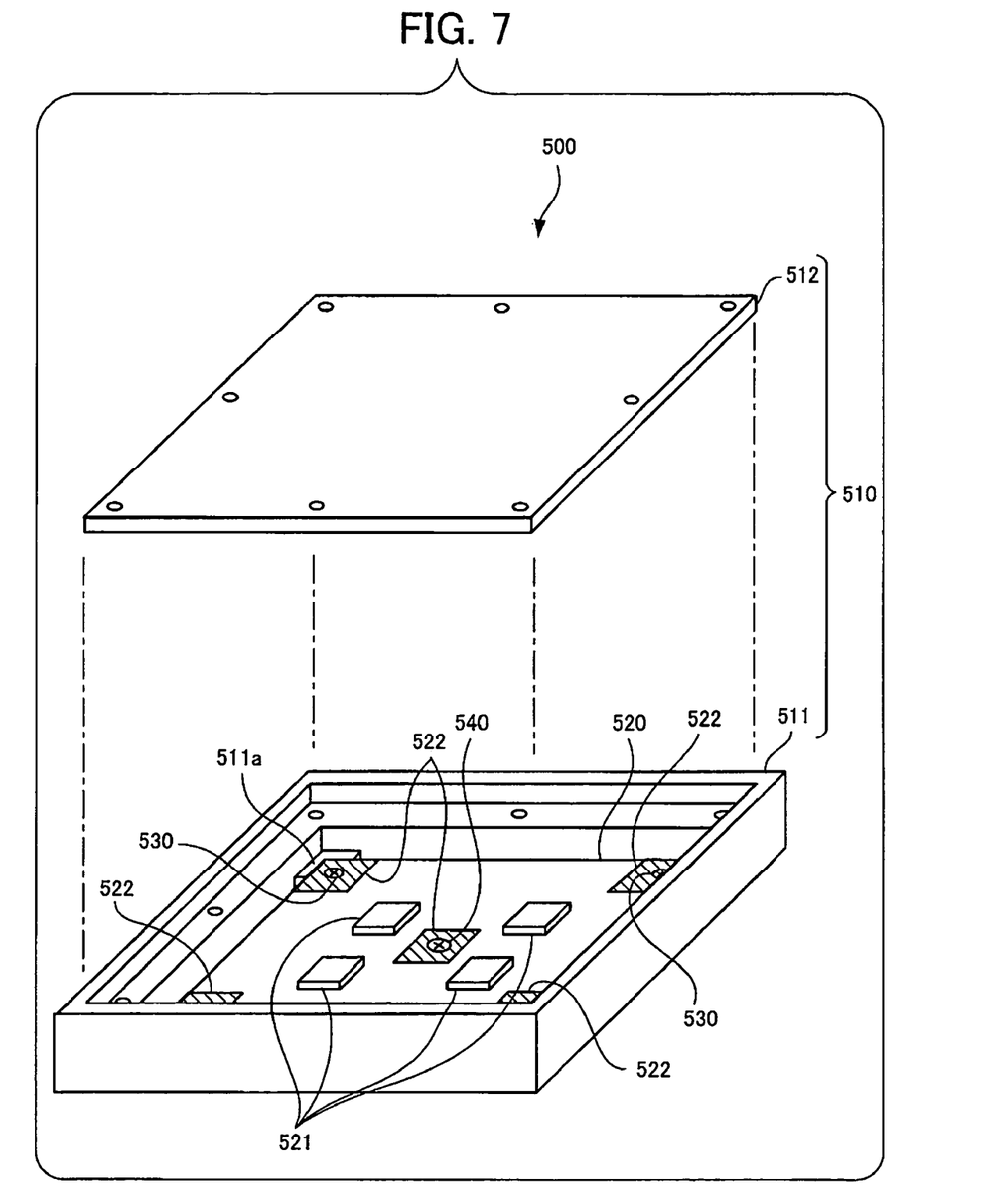
FIG. 7 schematically illustrates an example of the FG connection in the electronic device.

FIG. 7 schematically illustrates an example of the FG connection in the electronic device.

Referring to FIG. 7, an electronic device 500 includes a chassis 510 and a circuit board 520. The chassis 510 includes a metal box 511 and a metal cover 512, and the circuit board 520 is incorporated in the chassis 510.

Plural electronic components 521 are mounted on the circuit board 520, and a circuit is formed by the electronic components 521 and wiring patterns (not illustrated). In the circuit board 520, ground patterns 522 corresponding to a ground of the formed circuit are formed at four corners and in the center which is close to areas where the electronic components 521 are mounted in the surface of the circuit board 520.

In the circuit board 520, each of the four corners is tightened to each of board fixed sections 511a with a screw 530, and the center is tightened to a boss with a screw 540. The board fixed sections 511a are provided at the four corners of the box 511, and the boss is vertically provided from a bottom of the box 511 toward the circuit board 520. Therefore, the circuit board 520 is fixed to the box 511 while the ground pattern 522 is electrically connected to the box 511, and the FG connection of the circuit board 520 to the chassis 510 is performed.

Figure 8:
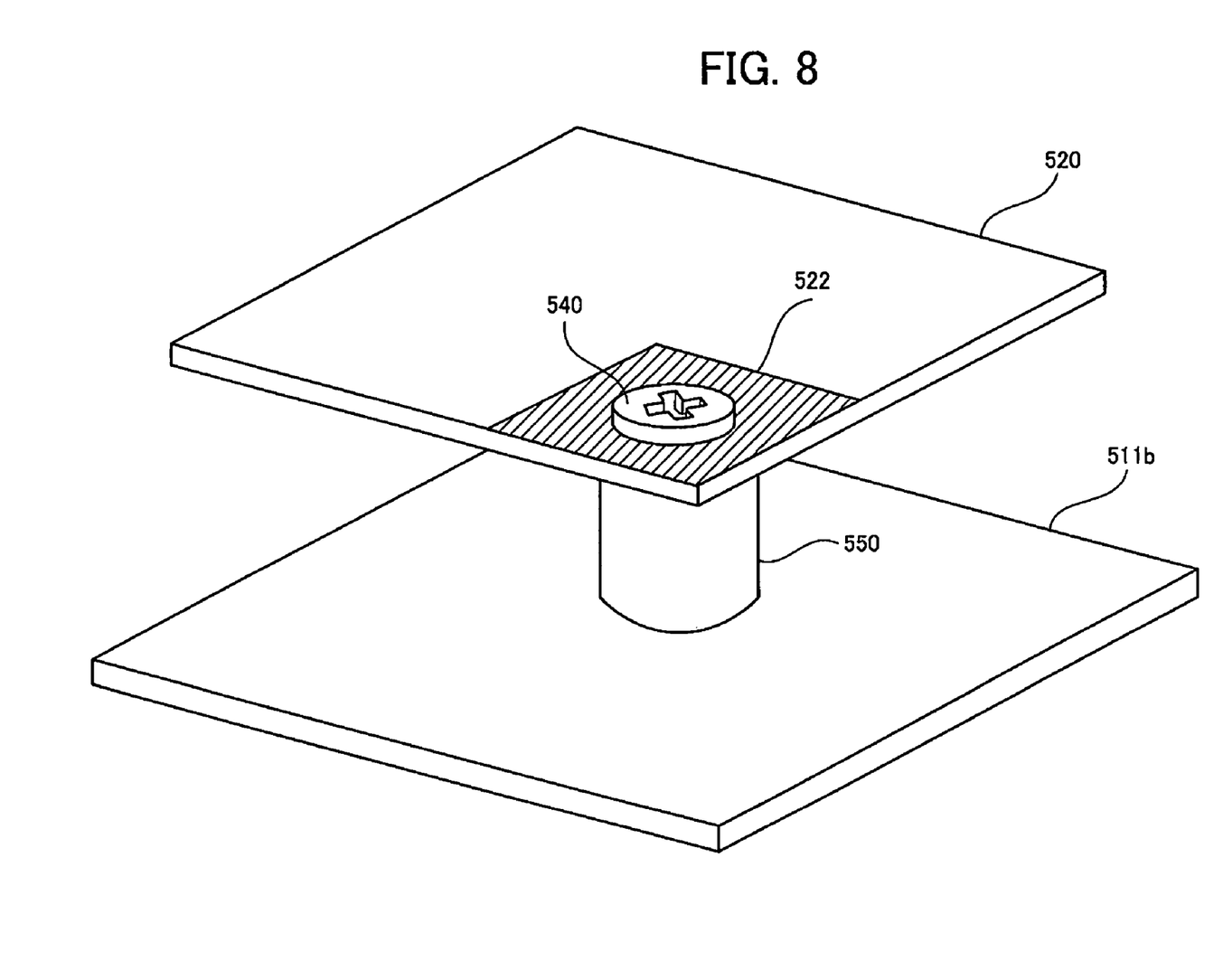
FIG. 8 schematically illustrates a state in which an area where a ground pattern is formed is tightened in a circuit board of FIG. 7.

FIG. 8 schematically illustrates a state in which an area where the ground pattern is formed is tightened in the circuit board of FIG. 7.

FIG. 8 typically illustrates the state in which the area where the ground pattern 522 is formed is tightened in the center of the circuit board 520.

As illustrated in FIG. 8, a boss 550 is vertically provided toward the circuit board 520 in a bottom 511b of the box 511 of FIG. 7, and the area where the ground pattern 522 is formed in the circuit board 520 is tightened to the boss 550 with the screw 540. In FIG. 8, the electronic component 521 of FIG. 7 is not illustrated for the sake of simple illustration.

In the example of FIGS. 7 and 8, the five ground patterns 522 are tightened to the box 511 with the screws 530 and 540, that is, the five ground patterns 522 are electrically connected to the chassis 510 of the electronic device 500 of FIG. 7, thereby performing the FG connection of the circuit board 520 to the chassis 510.

Recently a mobile electronic device such as a notebook type personal computer (notebook PC) is widely spread. In the electronic device such as the notebook PC, the FG connection of the built-in circuit board to the chassis is frequently performed by the structure illustrated in FIGS. 7 and 8.

At this point, in the electronic device such as the notebook PC, an external force is frequently applied to the chassis during carry. The chassis of the electronic device such as the notebook PC, as illustrated in FIG. 7, has a low profile in which a low sidewall is sandwiched between the wide cover and bottom. As a result, the external force is frequently applied to a direction intersecting the cover and bottom. Because the sidewall acts as a beam in an edge portion of the chassis, the sidewall is resistant to the external force applied to the direction intersecting the cover and bottom, and a deformation caused by the external force can be prevented. However, the center portions of the cover and bottom are susceptible to the external force, and the deformation such as deflection is easily generated.

For example, when the deformation is generated in the center portion of the cover or bottom by the external force in the electronic device 500 of FIG. 7, the external force propagates to the area where the ground pattern 522 is formed in the circuit board 520 by way of the center boss 550 of FIG. 8 used in the FG connection, thereby generating the deformation of the circuit board 520.

Generally the FG connections of the circuit board to the chassis are desirably performed at plural areas of the circuit board. When the FG connections are performed at the plural areas, some of the FG connections are performed near the electronic component like the center of the circuit board of FIG. 7. Therefore, a serious trouble such as a breakage of connection portion of the electronic component to the circuit board is possibly raised, when the deformation is generated near the electronic component of the circuit board by the external force propagating to the area where the ground pattern is formed.

In order to avoid the generation of the trouble, for example, the following FG connection is performed using the ground pattern which is formed while avoiding the neighborhood of the electronic component.

Figure 9:
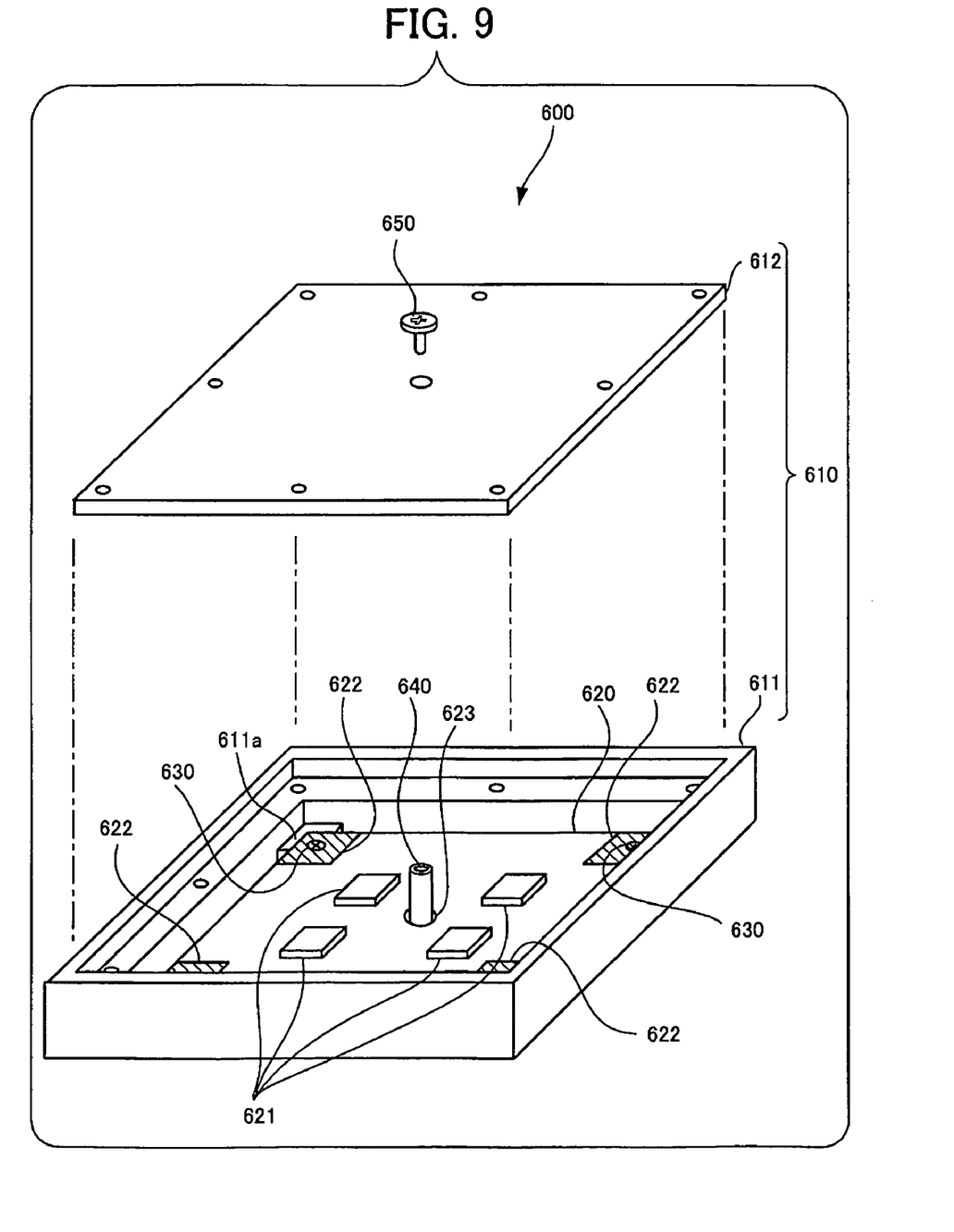
FIG. 9 schematically illustrates an example of the FG connection with a ground pattern which is formed while avoiding a neighborhood of an electronic component.

FIG. 9 schematically illustrates an example of the FG connection with the ground pattern which is formed while avoiding the neighborhood of the electronic component.

Referring to FIG. 9, similarly to the FG connection of FIG. 7, an electronic device 600 includes a chassis 610 and a circuit board 620. The chassis 610 includes a metal box 611 and a metal cover 612, and the circuit board 620 is incorporated in the chassis 610.

In the circuit board 620 on which plural electronic components 621 are mounted, ground patterns 622 are formed only at four corners while avoiding the neighborhood of the electronic component 621, and the FG connection is performed by tightening the circuit board 620 to the chassis 610 at the corners with screws 630. That is, in the example of FIG. 9, the FG connection is performed while avoiding the neighborhood of the electronic component 621 in the center of the circuit board 620.

Additionally, in the example of FIG. 9, a boss 640 is provided in order to strengthen the center portion of the cover 612 or the bottom of box 611. The boss 640 is vertically provided from the bottom of the box 611, and the boss 640 reaches the cover 612. The center of the cover 612 is tightened to the boss 640 with a screw 650. Therefore, in the circuit board 620, a through-hole 623 through which the boss 640 pierces is made in the center that is the neighborhood of the electronic component 621.

Figure 10:
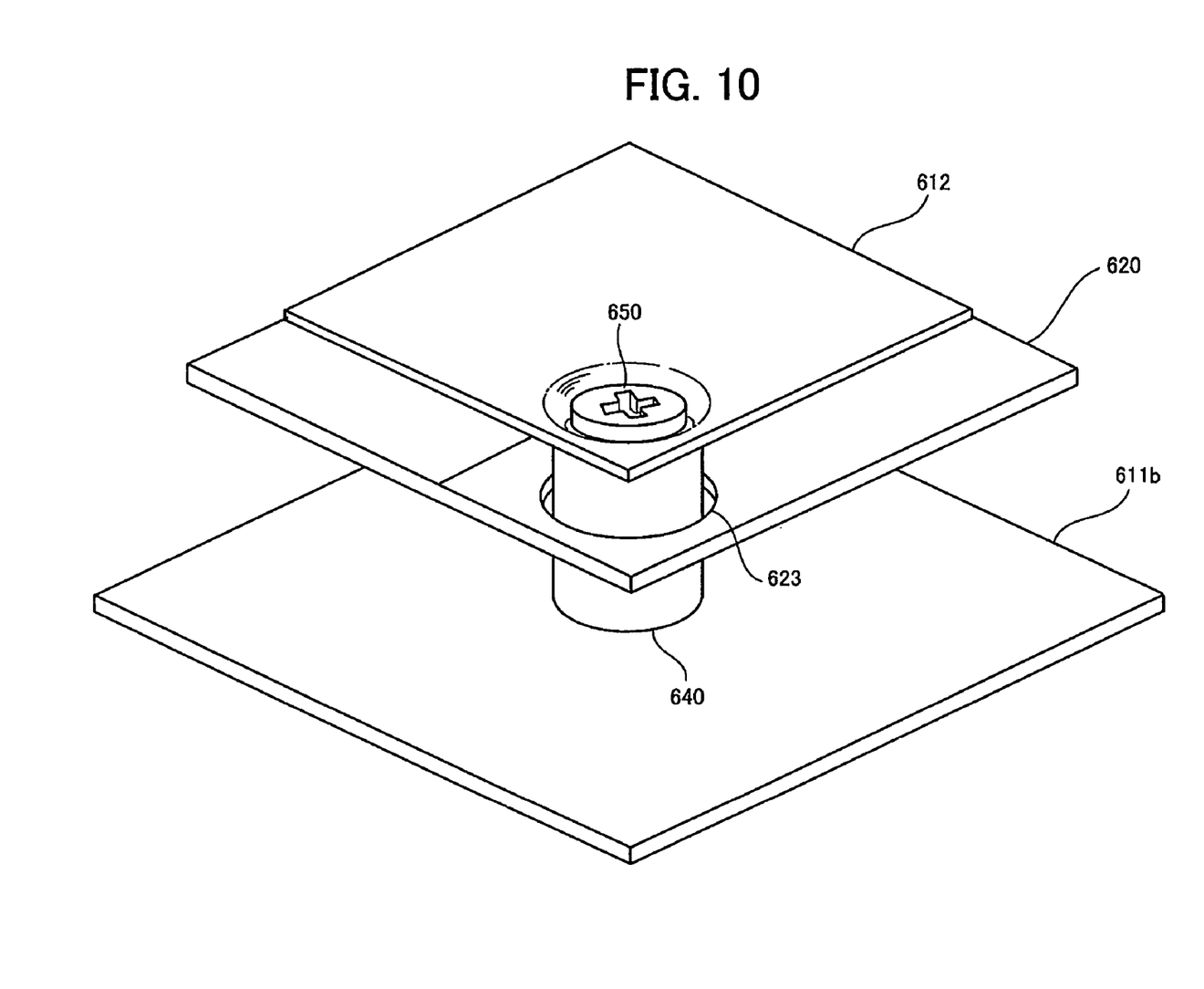
FIG. 10 is an enlarged view schematically illustrating surroundings of a through-hole in the circuit board of FIG. 7.

FIG. 10 is an enlarged view schematically illustrating surroundings of the through-hole in the circuit board of FIG. 7.

As illustrated in FIG. 10, because a diameter of the boss 640 is smaller than an inner diameter of the through-hole 623 in the circuit board 620, even if the deformation is generated in the center of the cover 612 or bottom 611b by the external force, the circuit board 620 is independent of the deformation. Therefore, the trouble such as the breakage of the connection portion of the electronic component 621 to the circuit board 620 of FIG. 9 can be avoided. However, in the example of FIGS. 9 and 10, because the ground pattern 622 used in the FG connection is formed while avoiding the neighborhood of the electronic component 621, the number of FG connections tends to be decreased, and a ground resistance of the circuit to the chassis 610 is increased to possibly deteriorate stability of a circuit operation.

Thus, the demand to realize the FG connections which are performed at as many areas as possible while suppressing the external force propagation to the built-in circuit board arises in the electronic device such as the notebook PC having the low-profile chassis that is susceptible to the external force applied in the center of the cover or bottom of the chassis.

For example, Japanese Laid-open patent Publication No. 2005-302789 discloses a technique of interposing a cushioning material having conductivity between the circuit board and the chassis-side boss used to tighten the circuit board to the chassis, and Japanese Laid-open patent Publication No. 2006-332515 discloses a technique of interposing a metal spring washer between the screw and the circuit board. A conductive resin such as a conductive elastomer is known as the cushioning material having the conductivity (for example, see Japanese Laid-open patent Publication No. 2004-72051). It can be considered that by applying the techniques disclosed in the above publications to the electronic device having the structure of FIGS. 7 and 8, the propagation of the external force applied to the cover or bottom of the chassis to the circuit board is suppressed by the cushioning material, so that the FG connection is performed near the electronic component to realize the FG connections at plural areas.

However, in the technique of interposing the cushioning material to suppress the external force propagation to the circuit board, there is a problem that the resistance of each FG connection is increased by the interposition, even though the cushioning material has conductivity.

SUMMARY

According to an aspect of the invention, an electronic device includes: a circuit board on which an electronic component is mounted; a plate material which is used as aground, the plate material being extended in parallel with the circuit board; and a ground connection member which includes a fixed section and multiple elastic leg sections, the fixed section being tightened to the circuit board and connected to a ground on the circuit board, the elastic leg sections being extended from the fixed section toward different directions along the circuit board, each of the elastic leg sections being extended onto the plate material side to elastically press the plate material.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Specific embodiments of the first electronic device whose basic mode is described, a second electronic device, and a ground connection structure will be described below with reference to the drawings.

A first embodiment of the invention will be described below.

Figure 1:
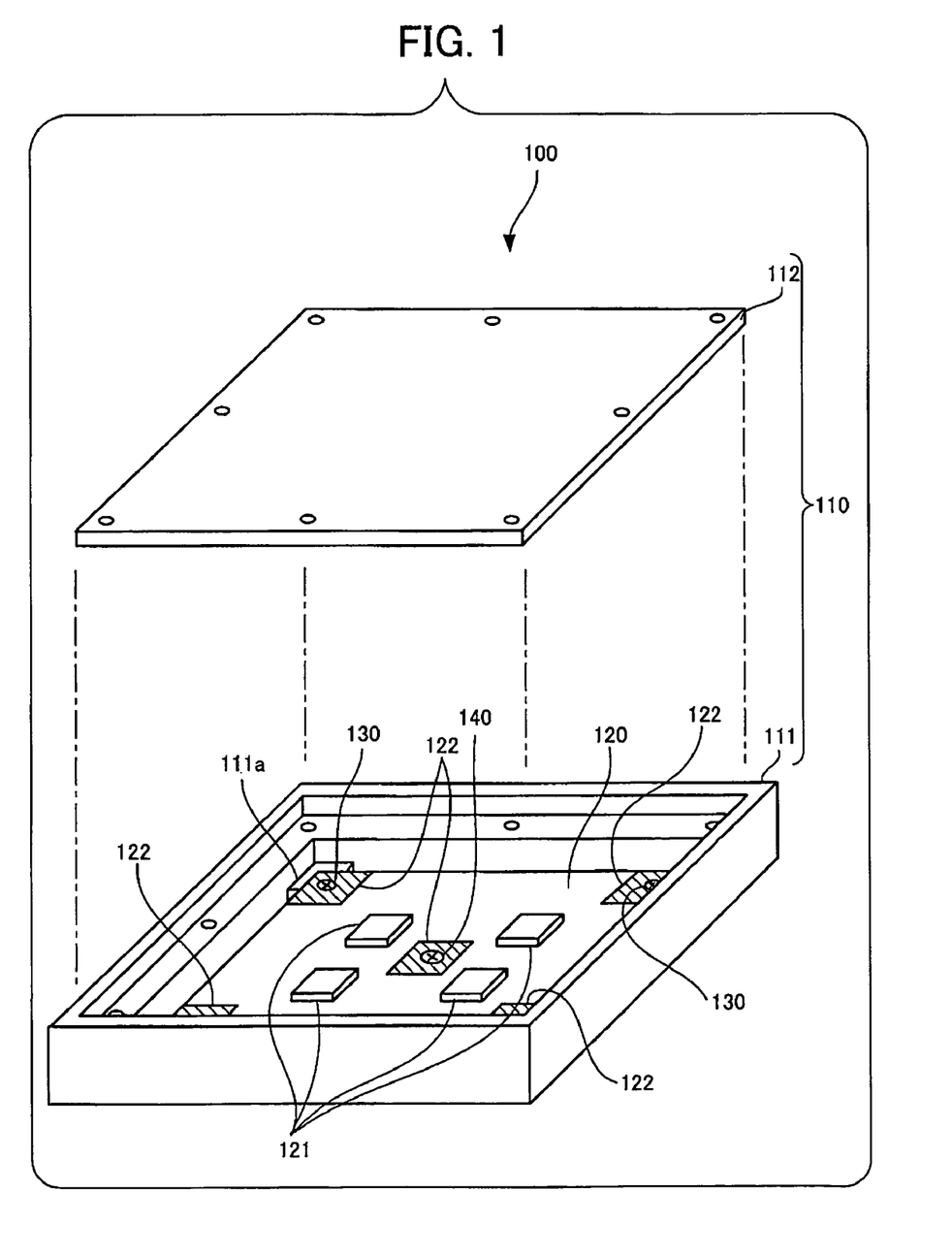
FIG. 1 schematically illustrates an electronic device according to a first embodiment of the invention.

FIG. 1 schematically illustrates an electronic device of the first embodiment.

An electronic device 100 of FIG. 1 is a low-profile electronic device such as a notebook PC. The electronic device 100 includes a low-profile chassis 110 and a circuit board 120. The low-profile chassis 110 includes a metal low-profile box 111 and a metal cover 112. The circuit board 120 is incorporated in the chassis 110. The electronic device 100 corresponds to an example of the first electronic device whose basic mode is described. The circuit board 120 corresponds to an example of the circuit board in the basic mode.

Plural electronic components 121 are mounted on the circuit board 120, and a circuit is formed by the electronic components 121 and wiring patterns (not illustrated). In the circuit board 120, ground patterns 122 corresponding to the ground of the formed circuit are formed at four corners and in the center which is close to the area where the electronic component 121 is mounted.

In the circuit board 120, each of the four corners is tightened to each of board fixed sections 111a with a screw 130, thereby fixing the circuit board 120 to the box 111. Accordingly, each of the ground patterns 122 at the four corners is electrically connected to the box 111 by way of the board fixed section 111a. The ground pattern 122 in the center of the circuit board 120 is electrically connected to the chassis 110 using the below-described embodiment of the ground connection structure. Therefore, in the first embodiment, the FG connections of the circuit board 120 to the chassis 110 are performed at five areas.

Figure 2:
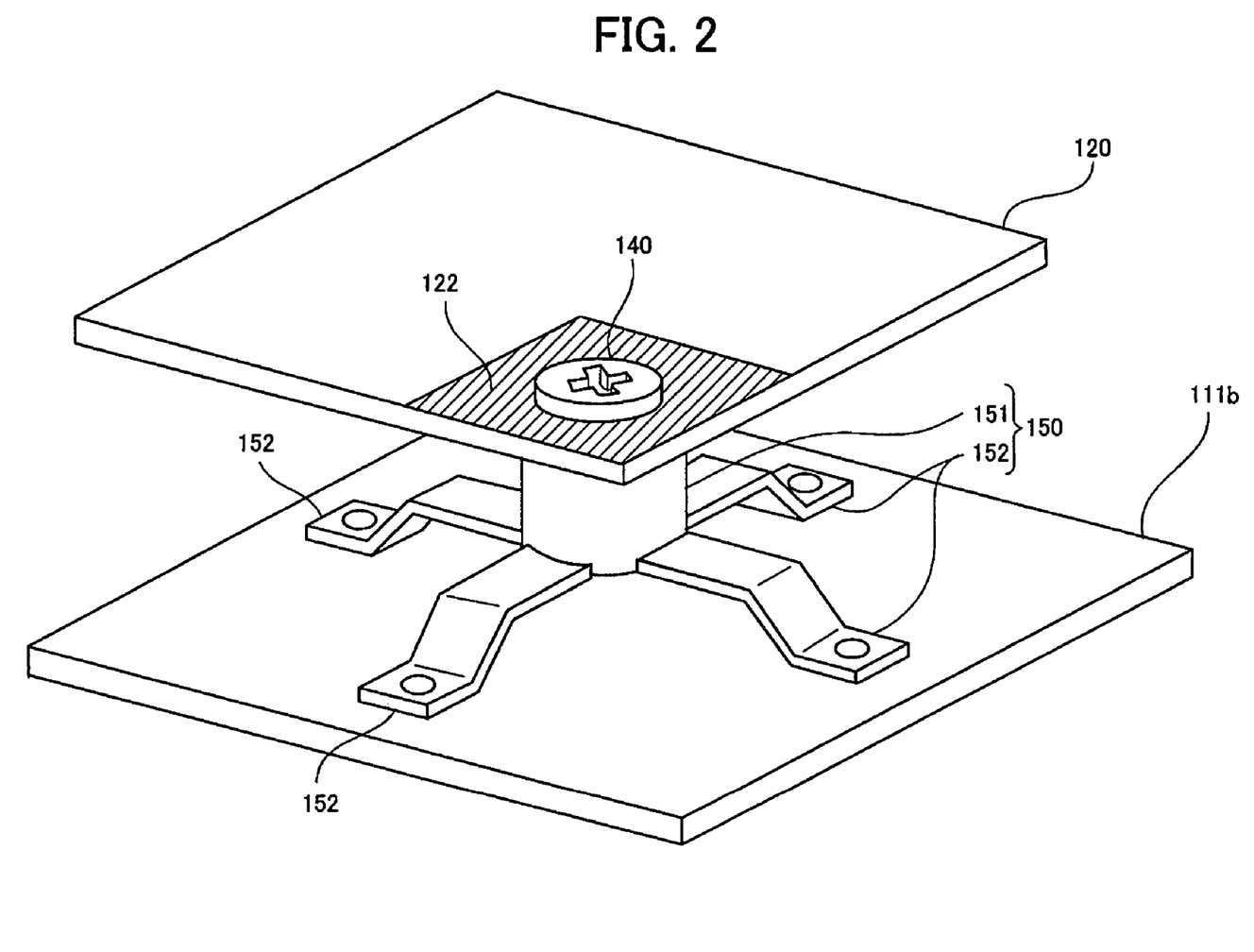
FIG. 2 schematically illustrates a FG connection in a center of a circuit board to a chassis.

FIG. 2 schematically illustrates the FG connection in the center of the circuit board to the chassis.

In the first embodiment, as illustrated in FIG. 2, the FG connection is realized in the center of the circuit board 120 by a ground connection member 150. The ground connection member 150 includes a metal stud 151 and four elastic leg sections 152. The elastic leg sections 152 are integrally fixed to the stud 151, and the elastic leg sections 152 are extended from the stud 151 toward different directions along the circuit board 120. The elastic leg sections 152 are extended toward the side of a bottom 111b to elastically press the bottom 111b.

The ground connection member 150 corresponds to an embodiment of the ground connection structure. The ground connection member 150 also corresponds to an example of the ground connection member in the basic mode of the first electronic device. The bottom 111b of the box 111 corresponds to an example of the plate material in the basic mode of the first electronic device. The stud 151 of the ground connection member 150 corresponds to an example of the fixed section in the basic mode of the first electronic device. The elastic leg section 152 corresponds to an example of the elastic leg section in the basic mode. The stud 151 corresponds to an example of the fixed section in the basic mode of the ground connection structure. The elastic leg section 152 corresponds to an example of a pressing section in the basic mode.

Here, it is preferable to employ an application mode of the ground connection structure in which the fixed section is located on the plate material side of the circuit board, the fixed section is tightened to the circuit board, and the pressing section includes an elastic leg section which is extended from the fixed section along the circuit board and extended onto the plate material side to elastically press the plate material.

Also, it is further preferable to employ another application mode of the ground connection structure in which the pressing section includes plural elastic leg sections that are extended from the fixed section toward plural directions to elastically press the plate material.

In these preferable application modes, the fixed section is tightened to the circuit board, so that the resistance can be suppressed in the electric connection between the fixed section and the circuit board. The elastic leg section can realize the elastic pressing to the plate material.

The elastic leg section 152 of the ground connection member 150 of the first embodiment also corresponds to an example of the elastic leg section in the application mode of the ground connection structure.

The metal stud 151 is fixed to the area where the ground pattern 122 is formed in the center of the circuit board 120 by tightening the stud 151 with a screw 140, and the stud 151 is electrically connected to the central ground pattern 122 via the screw 140. In each of the four metal elastic leg sections 152, an end portion on the side of the bottom 111b is fixed and electrically connected to the bottom 111b.

Figure 3:
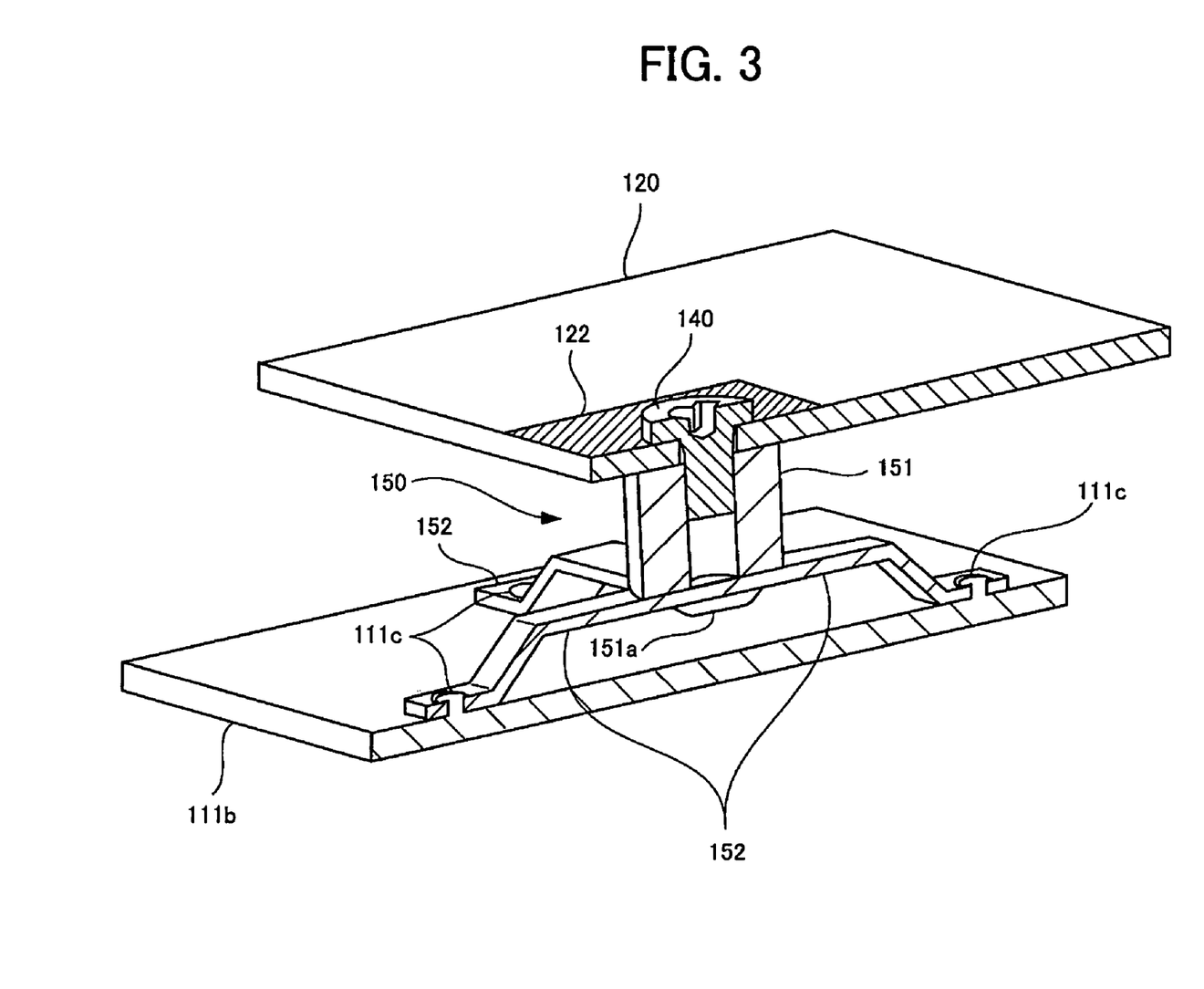
FIG. 3 schematically illustrates a section of a ground connection member relating to integral fixing of an elastic leg section to a stud of FIG. 2 and fixing of end portion of each elastic leg section to a bottom.

FIG. 3 schematically illustrates a section of the ground connection member relating to integral fixing of an elastic leg section to the stud of FIG. 2 and fixing of an end portion of each elastic leg section to the bottom.

In the first embodiment, as illustrated in FIG. 3, a part 151a of the stud 151 which is of a contact portion with the four elastic leg sections 152 is crushed toward the side of the elastic leg section 152 by thermal caulking, thereby integrally fixing the four elastic leg sections 152 to the stud 151. As illustrated in FIG. 3, in each of the four elastic leg section 152, a through-hole is made in the end portion on the side of the bottom 111b. A projection 111c projected from the bottom 111b is fit in the through-hole of each elastic leg section 152, and a leading-end portion of the projection 111c is crushed toward the side of the elastic leg section 152 by thermal caulking, thereby fixing and electrically connecting the end portion of each elastic leg section 152 to the bottom 111b.

Thus, in the first embodiment, the FG connection in which the ground pattern 122 in the center of the circuit board 120 is electrically connected to the chassis 110 is realized by the ground connection member 150 including the metal stud 151 and the four metal elastic leg sections 152. Therefore, the FG connections are realized at the total of five areas including the center and the four corners of the circuit board 120.

At this point, in the ground connection member 150 of the first embodiment, each of the four metal elastic leg sections 152 elastically presses the bottom 111b. As a result, in the chassis 110, even if the bottom 111b is deformed by the external force applied to the bottom 111b to which the four elastic leg sections 152 are fixed, the external force propagation to the circuit board 120 is absorbed by the four elastic leg sections 152. In the first embodiment, because the circuit board 120 is independent of the cover 112, even if the external force is applied to the cover 112 to generate the deformation of the cover 112, the propagation of the external force from the cover 112 to the circuit board 120 is avoided. That is, in the ground connection member 150, wherever the ground pattern is formed in the circuit board 120, the FG connection in which the external force propagation to the circuit board 120 is suppressed is realized.

In the first embodiment illustrated in FIG. 1, in the circuit board 120, the ground pattern 122 is electrically connected to the chassis 110 while the propagation of the external force is suppressed, using the ground connection member 150. The ground pattern 122 is formed in the center that is close to the electronic component 121, facing the center portion of the bottom 111b or cover 112 that is susceptible to the deformation generated in the chassis 110 by the external force.

In the ground connection member 150, because the stud 151 and the elastic leg sections 152 are integrally formed by the thermal caulking, the good FG connection is realized while the resistance is suppressed. Because the ground connection member 150 includes the four elastic leg sections 152, the resistance to the bottom 111b of the box 111 is further suppressed, thereby realizing the good FG connection.

Thus, in the first embodiment, using the ground connection member 150 which can suppress the external force propagation to the circuit board 120 to perform the good FG connection, the FG connection can be performed even in the neighborhood of the electronic component 121 in which the external force propagation is avoided. As a result, in the first embodiment, the FG connections are realized at the total of five areas including the neighborhood of the electronic component 121 in the circuit board 120.

Next, a second embodiment will be described below.

Figure 4:
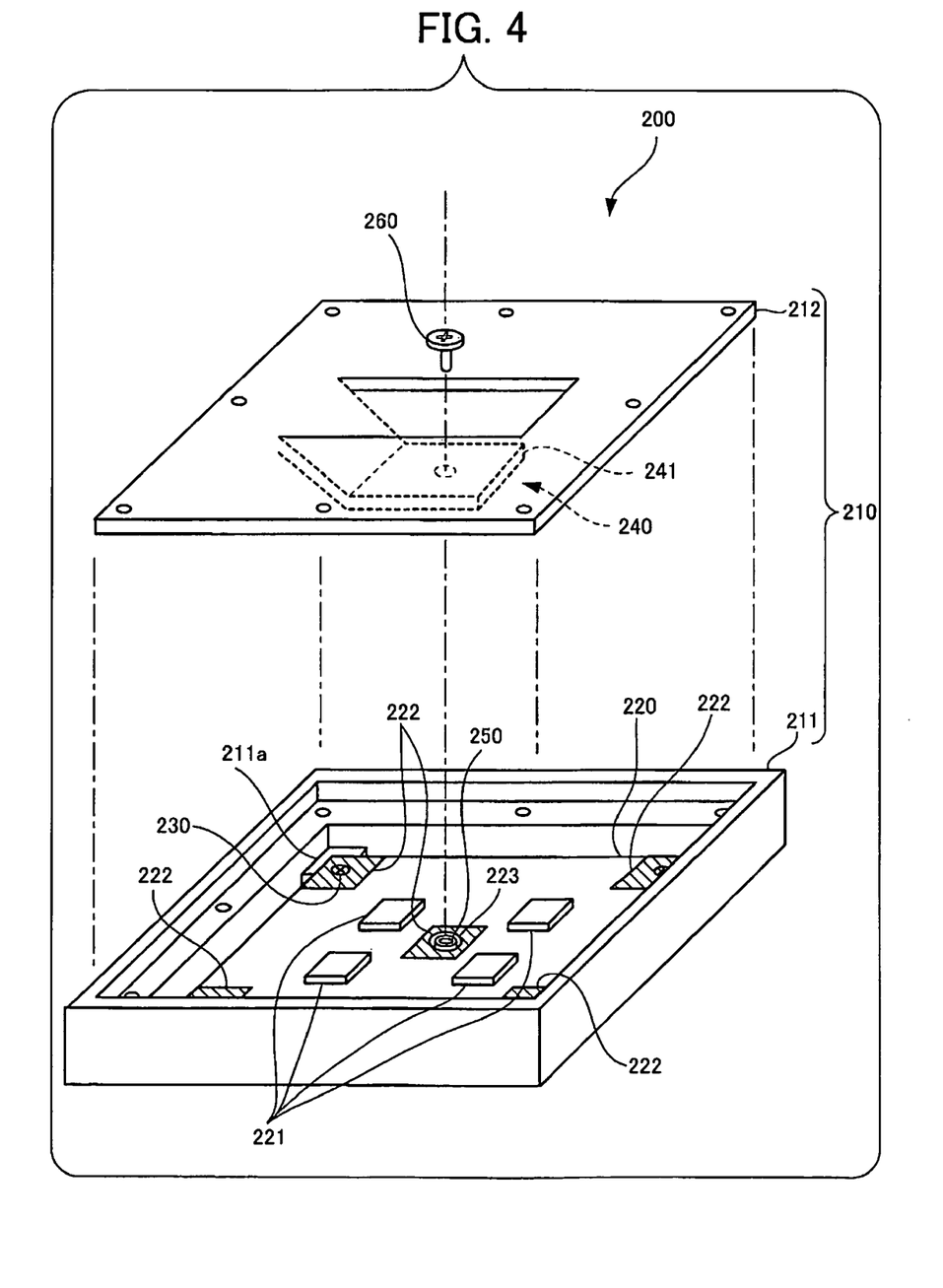
FIG. 4 schematically illustrates an electronic device according to a second embodiment of the invention.

FIG. 4 schematically illustrates an electronic device of the second embodiment.

Similarly to the electronic device 100 of the first embodiment of FIG. 1, an electronic device 200 of FIG. 4 is a low-profile electronic device such as a notebook PC. The electronic device 200 includes a low-profile chassis 210 and a circuit board 220. The low-profile chassis 210 includes a metal low-profile box 211 and a metal cover 212. The circuit board 220 is incorporated in the chassis 210. The electronic device 200 corresponds to an embodiment of the second electronic device. The circuit board 220 corresponds to an example of the circuit board in the basic mode.

Plural electronic components 221 are mounted on the circuit board 220, and a circuit is formed by the electronic components 221 and wiring patterns (not illustrated). In the circuit board 220, ground patterns 222 are formed at four corners and in the center that is near the electronic component 221. In the electronic device 200, because each of the four corners of the circuit board 220 is tightened with a screw 230 to each of board fixed sections 211a provided at the four corners of the box 211, the circuit board 220 is fixed to the box 211, and the FG connections are realized at the four corners of the circuit board 220.

In the second embodiment, the central ground pattern 222 near the electronic component 221 in the circuit board 220 is electrically connected to the chassis 210 by using the below-described embodiment of the ground connection structure, thereby performing the FG connection in the center. Accordingly, in the second embodiment, the FG connections of the circuit board 220 to the chassis 210 are realized at five areas in total.

In the second embodiment, a through-hole 223 piercing through the circuit board 220 is made in the center of the circuit board 220, and the central ground pattern 222 is spread around the through-hole 223. The cover 212 constituting the chassis 210 includes an elastic tongue piece 240. The elastic tongue piece 240 is cut and raised onto the side of the circuit board 220. A leading-end portion 241 of the elastic tongue piece 240 contacts the ground pattern 222 spread in the surroundings of the through-hole 223 of the circuit board 220. The leading-end portion 241 of the elastic tongue piece 240 is tightened to a metal boss 250 with a screw 260 while contacting the central ground pattern 222. The metal boss 250 is vertically provided toward the through-hole 223 from the bottom of the chassis 211. A diameter of the metal boss 250 is smaller than an inner diameter of the through-hole 223. In the second embodiment, the leading-end portion 241 elastically presses the central ground pattern 222 by tightening the leading-end portion 241 of the elastic tongue piece 240 to the boss 250, thereby the ground pattern 222 is electrically connected to both the cover 212 and box 211 of the chassis 210 to realize the FG connection in the center of the circuit board 220.

Figure 5:
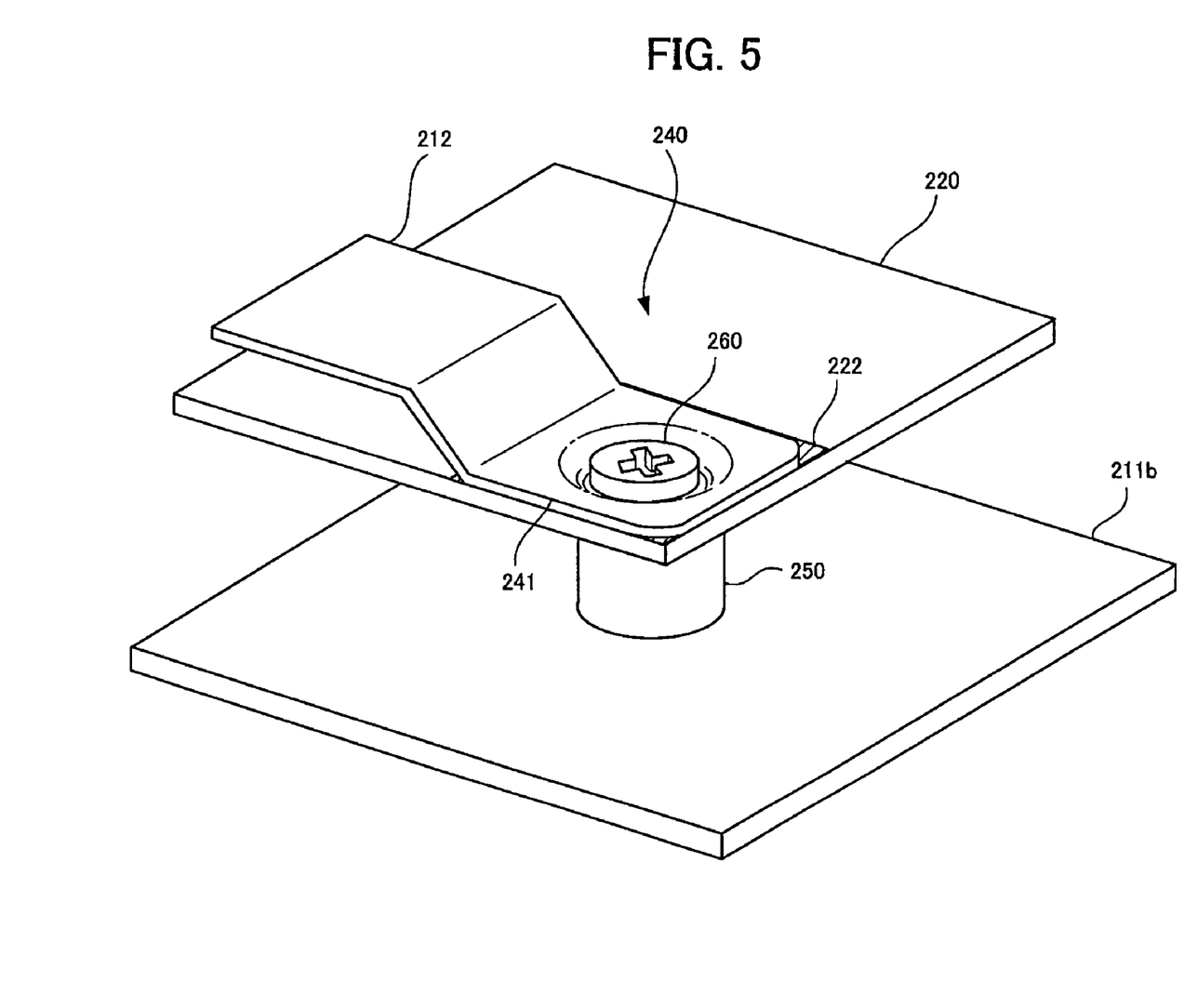
FIG. 5 schematically illustrates a FG connection in a center of a circuit board in the electronic device of FIG. 4.
Figure 6:
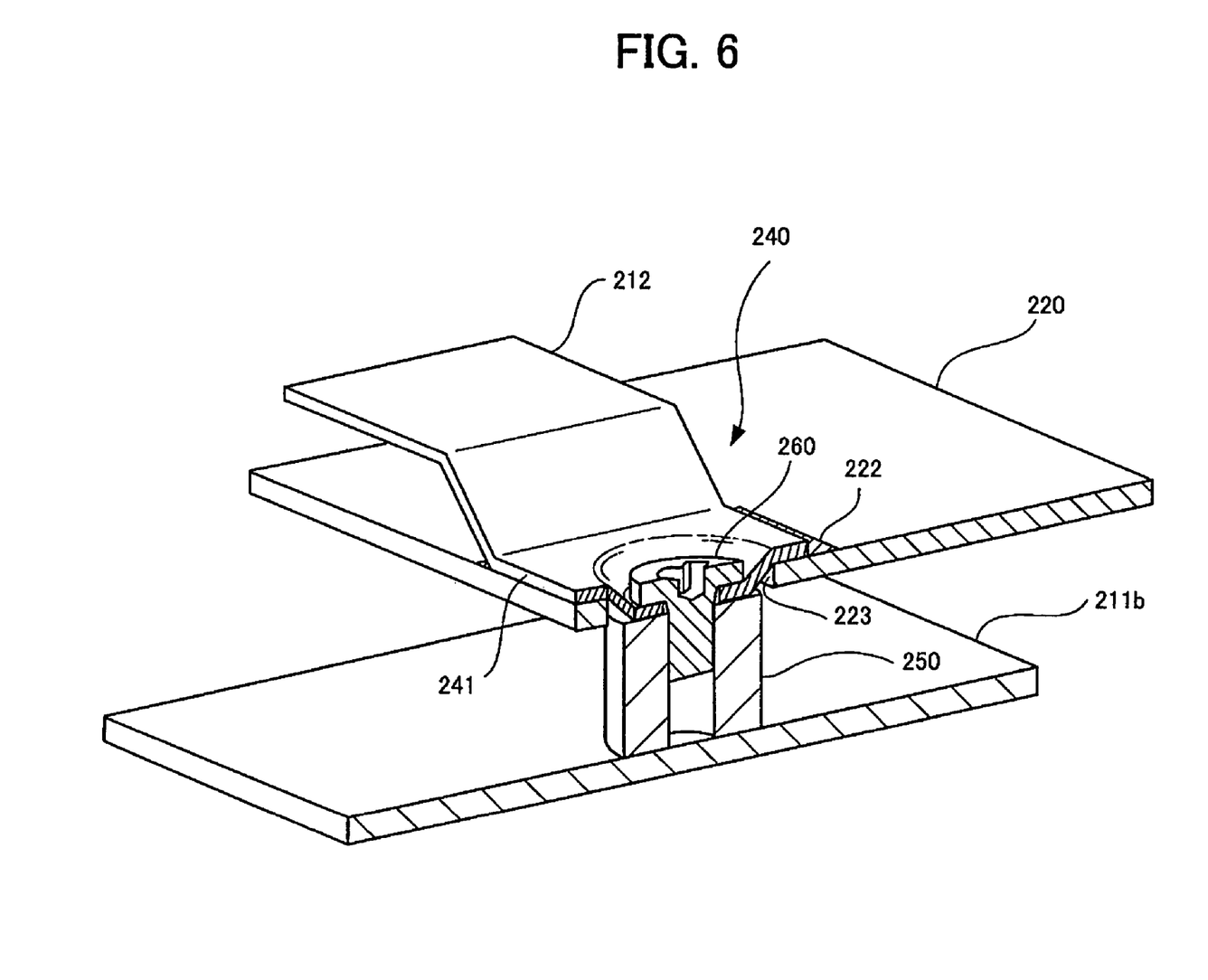
FIG. 6 schematically illustrates a section of an elastic tongue piece of FIGS. 4 and 5.

FIG. 5 schematically illustrates the FG connection in the center of the circuit board in the electronic device of FIG. 4, and FIG. 6 schematically illustrates a section of the elastic tongue piece of FIGS. 4 and 5.

As illustrated in FIGS. 5 and 6, in the leading-end portion 241 of the elastic tongue piece 240, the surroundings of the screw hole are swelled so as to enter in to the through-hole 223 of the ground pattern 222, and the portion having entered into the through-hole 223 is fixed to a leading end of the metal boss 250 with the screw 260.

In the second embodiment, the leading-end portion 241 is fixed to the boss 250 to pull the leading-end portion 241 toward the side of the circuit board 220, thereby the leading-end portion 241 elastically presses the central ground pattern 222. Therefore, the central ground pattern 222 is electrically connected to both the cover 212 and box 211 of the chassis 210.

The elastic tongue piece 240 of the second embodiment corresponds to an example of the elastic tongue piece in the basic mode of the second electronic device. The cover 212 of the chassis 210 corresponds to an example of the first plate material in the basic mode of the second electronic device. The boss 250 corresponds to an example of the boss in the basic mode. The bottom 211b of the box 211 corresponds to an example of the second plate material in the basic mode.

Here, it is preferable to employ another application mode of the ground connection structure in which the plate material includes two plate materials that are spread in parallel with each other while the circuit board is interposed therebetween, the circuit board has a through-hole that pierces through the circuit board, a first plate material of the two plate materials includes an elastic tongue piece whose leading-end portion contacts surroundings of the through-hole of the circuit board, the elastic tongue piece being cut and raised onto the circuit board side, a second plate material of the two plate materials includes a boss that is vertically provided toward the through-hole of the circuit board, and the leading-end portion of the elastic tongue piece elastically presses the circuit board by tightening the leading-end portion of the elastic tongue piece and the boss to each other.

According to this preferable application mode, the FG connection is performed by the elastic tongue piece. The elastic tongue piece is cut and raised from the first plate material, and the first plate material constitutes the plate material which is used as the ground. The external force applied to the first or second plate material is absorbed by the elastic tongue piece, so that the good FG connection in which the propagation of the external force from the plate material to the circuit board is suppressed can easily realized. In the preferable application mode, the elastic tongue piece is cut and raised from the first plate material, so that the resistance can further be suppressed in the FG connection. In the elastic tongue piece, because the leading-end portion is tightened to the boss, the resistance of the FG connection to the second plate material is also suppressed. Therefore, the resistance can further be suppressed in the FG connection.

The elastic tongue piece 240 corresponds to an example of the elastic tongue piece in the application mode of the ground connection structure. The cover 212 of the chassis 210 also corresponds to an example of the first plate material in the application mode of the ground connection structure. The boss 250 also corresponds to an example of the boss in the application mode. The bottom 211b of the box 211 also corresponds to an example of the second plate material in the application mode.

In the electronic device 200 of FIGS. 4 to 6, it is assumed that the bottom 211b is bent toward the side of the circuit board 220 by the external force applied to the bottom 211b. In the second embodiment, the diameter of the boss 250 is smaller than the inner diameter of the through-hole 223, and the elastic tongue piece 240 elastically presses the ground pattern 222 spread around the through-hole 223. Therefore, the boss 250 whose diameter is smaller than the inner diameter of the through-hole 223 is pushed by the bent bottom 211b to enter into the through-hole 223, thereby bending the elastic tongue piece 240. Thus, if the external force is applied to the bottom 211b, the external force is absorbed by the elastic tongue piece 240. If the cover 212 is bent toward the side of the circuit board 220 by the external force applied to the cover 212, the elastic tongue piece 240 is bent by a bent amount of the cover 212, thereby absorbing the external force.

Thus, in the second embodiment, the FG connection is performed with the elastic tongue piece 240 in the neighborhood of the electronic component 121 in the circuit board 220. The neighborhood of the electronic component 121 faces the center portion of the bottom 211b or cover 212 in which the deformation is easily generated by the external force. The FG connections are realized at the total of five areas including the four corners and the center of the circuit board 220.

In the second embodiment, in the ground connection member 250, the elastic tongue piece 240 which is cut and raised from the cover 212 plays a role in the electric connection of the central ground pattern 122 to the cover 212. Therefore, the central ground pattern 122 is electrically connected to the cover 212 while the resistance is suppressed. In the second embodiment, the central ground pattern 122 is also electrically connected to the bottom 211b of the box 211 through the boss 250. Therefore, in the second embodiment, the good FG connection is realized while the resistance of the circuit board 220 to the chassis 210 of FIG. 4 is suppressed.

Thus, in the second embodiment, by using the elastic tongue piece 240 in which the external force propagation to the circuit board 220 can be suppressed to perform the good FG connection, the FG connection can be performed in the neighborhood of the electronic component 221 in which the external force propagation is avoided. As a result, in the second embodiment, the FG connections are realized at the total of five areas including the neighborhood of the electronic component 221 in the circuit board 220.

In the above explanation, only one ground connection member 150 or elastic tongue piece 240 is used as the specific embodiment of the first electronic device or second electronic device. However, the specific embodiment of the first electronic device or second electronic device is not limited to the above example. For example, multiple ground connection members 150 may be used, multiple elastic tongue pieces 240 may be used, or both the ground connection member 150 and the elastic tongue piece 240 may be used together to mix the embodiment of the first electronic device and the embodiment of the second electronic device.

In the above explanation, the example in which the FG connections are performed at the five areas is cited as the specific embodiment of the first electronic device or second electronic device. However, the specific embodiment of the first electronic device or second electronic device is not limited to the above example. For example, the number of areas where the FG connections are performed may be changed.

In the above explanation, the ground connection member 150 including the four elastic leg sections is cited as an example of the ground connection structure and ground connection member. However, the ground connection structure and ground connection member are not limited to the ground connection member 150 and may include arbitrary number of elastic leg sections.

In the above explanation, the ground connection member 150 in which the stud 151 and the elastic leg section 150 are integrally formed by the thermal caulking is cited as an example of the ground connection structure and ground connection member. However, the ground connection structure and ground connection member are not limited to the ground connection member 150. For example, the stud and the elastic leg section may be integrally formed by welding or tightening with a screw.

In the above explanation, the ground connection member 150 in which the elastic leg section is fixed and electrically connected to the bottom of the chassis by the thermal caulking is cited as an example of the ground connection structure and ground connection member. However, the ground connection structure and ground connection member are not limited to the ground connection member 150. For example, the elastic leg section may be fixed and electrically connected to the bottom of the chassis by welding or tightening with a screw.

According to the basic mode of the first electronic device, the ground connection (FG connection) between the ground on the circuit board and the plate material spread in parallel with the circuit board in the chassis of the electronic device is realized by the ground connection member. In the ground connection member, because the external force applied to the plate material is absorbed by the plural elastic leg sections, the FG connection in which the external force propagation to the circuit board is suppressed can be realized, wherever in the circuit board the ground pattern may be formed. Therefore, in the basic mode of the first electronic device, since the FG connection is performed even near the electronic component mounted on the circuit board, the FG connections can be performed at many areas of the circuit board. Additionally, in the basic mode of the first electronic device, the suppression of the resistance in the FG connection is realized by the integral structure of the fixed section and the elastic leg section. That is, in the basic mode of the first electronic device, the good FG connections can be performed at many areas.

According to the basic mode of the second electronic device, the ground connection (FG connection) between the ground pattern corresponding to the ground on the circuit board and the plate material spread in parallel with the circuit board in the chassis of the electronic device is realized by pressing the ground pattern by the leading-end portion of the elastic tongue piece, which is apart of the first plate material. The external force applied to the first or second plate material is absorbed by the elastic tongue piece, so that the FG connection in which the propagation of the external force to the circuit board is suppressed can be realized, wherever in the circuit board the ground pattern may be formed. Therefore, in the basic mode of the second electronic device, since the FG connection is performed even near the electronic component mounted on the circuit board, the FG connections can be performed at many areas of the circuit board. Additionally, in the basic mode of the second electronic device, since the elastic tongue piece is integral with the first plate material, formed by being cut and raised from the first plate material, the resistance can further be suppressed in the FG connection. That is, in the basic mode of the second electronic device, the good FG connections can be performed at many areas.

According to the basic mode of the ground connection structure, the ground connection (FG connection) between the ground on the circuit board and the bottom spread in parallel with the circuit board in the chassis in which the circuit board is accommodated is realized by the fixed section and the pressing section. Because the pressing section elastically presses the circuit board or the plate material, even if the external force is applied to the plate material, the external force propagation to the circuit board is absorbed by the pressing section. That is, in the basic mode of the ground connection member, the FG connection in which the external force propagation to the circuit board is suppressed can be realized, wherever in the circuit board the ground pattern may be formed. Therefore, since the FG connection is performed even near the electronic component mounted on the circuit board, the FG connections can be performed at many areas of the circuit board. Additionally, in the basic mode of the ground connection member, the suppression of the resistance in the FG connection is realized by the integral structure of the fixed section and the pressing section. That is, in the basic mode of the ground connection structure, the good FG connections can be performed at many areas.

As described above, according to the invention, the good FG connections can be performed at many areas.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. An electronic device comprising:
a circuit board on which an electronic component is mounted;
a plate material which is used as a ground, the plate material being extended in parallel with the circuit board; and
a ground connection member which comprises a fixed section and a plurality of elastic leg sections, the fixed section being tightened to the circuit board and connected to a ground on the circuit board, the elastic leg sections being extended from the fixed section toward different directions parallel to the circuit board, each of the elastic leg sections being extended onto a side of the plate material to elastically press the plate material, wherein
an end portion of each of the elastic leg sections on the side of the plate material is provided with a through hole into which a projection projected from the plate material is fit, and a leading-end portion of each of the projections is crushed toward a side of the respective elastic leg section by thermal caulking so that the end portion of each of the elastic leg sections on the side of the plate material is fixed and electrically connected to the plate material.

2. A ground connection structure which is located between a ground on a circuit board and a plate material, the plate material being used as a ground while extended in parallel with the circuit board,
the ground connection structure comprising:
a fixed section which is fixed to one of the circuit board and the plate material; and
a pressing section which elastically presses the other of the circuit board and the plate material, wherein
the fixed section is located on a side of the plate material of the circuit board, the fixed section being tightened to the circuit board by a screw and electrically connected to the ground on the circuit board by the screw,
the pressing section comprises an elastic leg section which is extended from the fixed section parallel to the circuit board and extended onto the side of the plate material to elastically press the plate material, and
an end portion of the elastic leg section on the side of the plate material is provided with a through hole into which a projection projected from the plate material is fit, and a leading-end portion of the projection is crushed toward a side of the elastic leg section by thermal caulking so that the end portion of the elastic leg section on the side of the plate material is fixed and electrically connected to the plate material.

3. The ground connection structure according to claim 2, wherein the pressing section comprises a plurality of elastic leg sections which are extended from the fixed section toward a plurality of directions to elastically press the plate material.

* * * * *